US012174259B1

(12) United States Patent
Mehrotra et al.

(10) Patent No.: US 12,174,259 B1
(45) Date of Patent: Dec. 24, 2024

(54) LASER-BASED METHOD AND SYSTEM FOR TRIGGERING THERMAL RUNAWAY OF A BATTERY

(71) Applicant: United States of America as represented by the Administrator of the National Aeronautics and Space, Washington, DC (US)

(72) Inventors: Angad Mehrotra, Houston, TX (US); John J. Darst, Houston, TX (US); Eric Darcy, Houston, TX (US); Romil Patil, Houston, TX (US); Safan Abbasi, Arlington, VA (US)

(73) Assignee: United States of America as represented by the Administrator of NASA, Washington, DC (US)

( * ) Notice: Subject to any disclaimer, the term of this patent is extended or adjusted under 35 U.S.C. 154(b) by 963 days.

(21) Appl. No.: 16/952,885

(22) Filed: Nov. 19, 2020

Related U.S. Application Data

(60) Provisional application No. 62/938,571, filed on Nov. 21, 2019.

(51) Int. Cl.
*G01R 31/36* (2020.01)
*G01R 31/367* (2019.01)
*H01M 10/42* (2006.01)

(52) U.S. Cl.
CPC ...... *G01R 31/367* (2019.01); *H01M 10/4285* (2013.01)

(58) Field of Classification Search
CPC .................................................. H01M 10/48
See application file for complete search history.

(56) References Cited

U.S. PATENT DOCUMENTS

2017/0059500 A1* 3/2017 Honda ................ H01M 10/488
2019/0243931 A1* 8/2019 Feng ..................... H01M 10/48

OTHER PUBLICATIONS

Borger et a. "thermal runaway and thermal runaway propagation in batteries:what do we talk about?" (2019).*
Yangying et al., "Fast lithium growth and short circuit induced by localized-temperature hotspots in lithium batteries," Zhu, Nature Communications (2019) 10:2067.

* cited by examiner

*Primary Examiner* — Austin Murata
(74) *Attorney, Agent, or Firm* — Kurt G. Hammerle; Edward K. Fein

(57) ABSTRACT

A method for testing a battery cell includes directing a laser radiation from a laser at a radiation-receiving location on a can of the battery cell to trigger a thermal runaway event. A power, a wavelength, and a beam size of the laser radiation are selected based on a test stability of the battery cell when triggering the thermal runaway event. The test stability includes a likelihood that the can will breach in response to triggering the thermal runaway event. The method also includes ceasing to contact the radiation-receiving location with the laser radiation in response to the thermal runaway event.

10 Claims, 8 Drawing Sheets

LASER-BASED METHOD AND SYSTEM FOR TRIGGERING THERMAL RUNAWAY OF A BATTERY

CROSS-REFERENCE TO RELATED APPLICATIONS

This application claims priority to Provisional Patent Application No. 62/938,571, filed on Nov. 21, 2019, the entirety of which is incorporated by reference herein.

GOVERNMENT RIGHTS

The invention described herein was made by employees of the United States Government and may be manufactured and used by or for the Government of the United States of America for governmental purposes without the payment of any royalties thereon or therefor.

BACKGROUND

Thermal runaway (TR) is a physical phenomenon where an increase in the temperature of a battery cell causes a corresponding increase in reaction rate, which further increases the temperature. This causes the reaction speed to 'run away', producing explosive results. In the case of a lithium ion (Li-ion) battery, this means the release of hot ejected gases and solids at 1000+ degrees Celsius and a violent over pressurization of the cell.

To study the effects of thermal runaway on a cell or larger integrated assembly, it is sometimes desirable to intentionally produce such a reaction. Conventional methods of initiating thermal runaway fall into three major categories: mechanical, thermal, and electrical. Mechanical methods imply the physical molestation of the cell can either internally or externally via crushing, screw/nail penetration, denting, or implantation of shape memory metals. Thermal methods use some form of energy input such as hot air, contact heating via electrically driven heaters, induction or other means to drive runaway. Electrical methods produce thermal runaway via overcharging or otherwise electrically damaging the chemistry of the cell.

These techniques all have their place in a battery testing space, but each is saddled with unique drawbacks and advantages that make them more or less suitable for a given test condition. Mechanical methods often add no additional energy to a system, but require inherently changing the failure mode by adding a hole or dent that changes the flow characteristics of the rapidly moving hot gases during runaway. Thermal methods are prone to biasing adjacent and surrounding cells by adding extra heat energy, reducing the system's ability to cope with the thermal stress of a thermal runaway, creating overtest. These methods are also prone to biasing the mechanism of cell failure by weakening the can of the cell near the heaters/induction field/etc. Electrical methods such as overcharge also create extreme overtest by introducing a higher quantity of energy than is realistic in a field-like failure. In other cases, a particular method is simply unsuitable due to physical placement, such is the difficulty in triggering a center cell in a large battery assembly using an induction heater or nail penetrator.

SUMMARY

A method for testing a battery cell is disclosed. The method includes directing a laser radiation from a laser at a radiation-receiving location on a can of the battery cell to trigger a thermal runaway event. A power, a wavelength, and a beam size of the laser radiation are selected based on a test stability of the battery cell when triggering the thermal runaway event. The test stability includes a likelihood that the can will breach in response to triggering the thermal runaway event. The method also includes ceasing to contact the radiation-receiving location with the laser radiation in response to the thermal runaway event.

A method for testing a plurality of battery cells is also disclosed. The method includes directing a laser radiation at the battery cells until a thermal runaway event is triggered in each battery cell. The method also includes determining a stability of the battery cells based at least partially upon the thermal runaway events. The stability includes a likelihood that the battery cells will vent and fail without breaching through a can of each battery cell where the laser radiation contacts the can. The method also includes determining a flux curve based at least partially upon the stability of the battery cells. The method also includes generating a model based at least partially upon the stability, the flux curve, or both.

A method of testing a battery cell using a laser system is also disclosed. The battery cell has a cell container made of metal. The method includes applying a beam-absorbing coating on the cell container. The beam-absorbing coating covers at least a portion of a first radiation-receiving location of the cell container. The method also includes operating the laser system in a curing mode to direct radiation to the beam-absorbing coating to cure the beam-absorbing coating to form a cured coating. The laser is at a first laser power when in the curing mode. The method also includes operating the laser system in a thermal-heating mode to direct radiation to the cured coating to heat the battery cell to generate a thermal runaway condition. The laser is at a second laser power when in the thermal heating mode. The second laser power is greater than the first laser power.

A system for testing a battery cell is also disclosed. The system includes a housing. The system also includes a laser positioned at least partially within the housing. The laser is configured to generate a laser radiation. The system also includes a lens enclosure positioned at least partially within the housing. The laser radiation is configured to pass through the lens enclosure. The lens enclosure is configured to collimate the laser radiation. The system also includes a holding device positioned at least partially within the housing. The holding device is configured to hold the battery cell. The laser radiation is configured to contact the battery cell after being collimated by the lens enclosure, which triggers a thermal runaway event for the battery cell.

This summary is provided to introduce a selection of concepts that are further described below in the detailed description. This summary is not intended to identify key or essential features of the claimed subject matter, nor is it intended to be used as an aid in limiting the scope of the claimed subject matter.

BRIEF DESCRIPTION OF THE DRAWINGS

The following figures form part of the present specification and are included to further demonstrate certain aspects of the presently described subject matter and should not be used to limit it. The present subject matter may be better understood by reference to one or more of these drawings in combination with the description of embodiments presented herein. Consequently, a more complete understanding of the present embodiments and further features and advantages thereof may be acquired by referring to the following description taken in conjunction with the accompanying drawings, in which like reference numerals may identify like elements, wherein.

DETAILED DESCRIPTION

Reference may now be made in detail to specific embodiments illustrated in the accompanying drawings and figures. In the following detailed description, numerous specific details are set forth in order to provide a thorough understanding of the embodiments described herein. However, it may be apparent to one of ordinary skill in the art that other embodiments may be practiced without these specific details. In other instances, well-known methods, procedures, components, circuits, and networks have not been described in detail so as not to unnecessarily obscure aspects of the embodiments.

It may also be understood that, although the terms first, second, etc. may be used herein to describe various elements, these elements should not be limited by these terms. These terms are only used to distinguish one element from another. For example, a first object could be termed a second object, and, similarly, a second object could be termed a first object, without departing from the scope of the present disclosure.

The terminology used herein is for the purpose of describing particular embodiments only and is not intended to be limiting. As used in the description and the appended claims, the singular forms "a," "an" and "the" are intended to include the plural forms as well, unless the context clearly indicates otherwise. It may also be understood that the term "and/or" as used herein refers to and encompasses any and possible combinations of one or more of the associated listed items. It may be further understood that the terms "includes," "including," "comprises" and/or "comprising," when used in this specification, specify the presence of stated features, integers, steps, operations, elements, and/or components, but do not preclude the presence or addition of one or more other features, integers, operations, elements, components, and/or groups thereof. Further, as used herein, the term "if" may be construed to mean "when" or "upon" or "in response to determining" or "in response to detecting," depending on the context.

As used herein, the terms "inner" and "outer"; "up" and "down": "upper" and "lower"; "upward" and "downward"; "above" and "below"; "inward" and "outward"; and other like terms as used herein refer to relative positions to one another and are not intended to denote a particular direction or spatial orientation. The terms "couple," "coupled." "connect," "connection," "connected," "in connection with," and "connecting" refer to "in direct connection with" or "in connection with via one or more intermediate elements or members."

Figure 1:
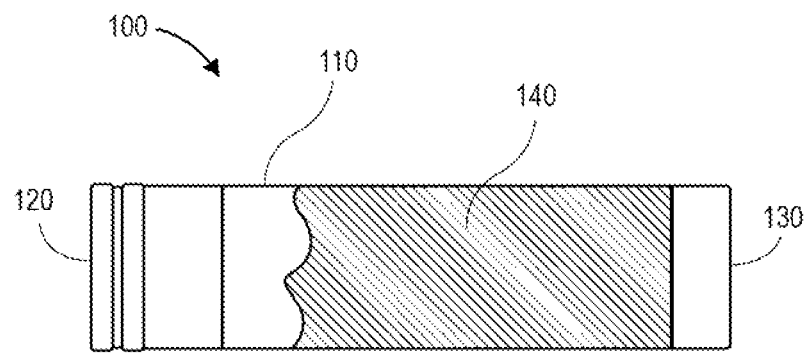
FIG. 1 illustrates a side view of a battery cell, according to an embodiment.

FIG. 1 illustrates a side view of a battery cell 100, according to an embodiment. The battery cell 100 may be or include an electrochemical cell that is configured to supply power to an electrical device. In one example, the battery cell 100 may be or include a lithium-ion (Li-ion) battery cell. The battery cell 100 may include a can 110. As shown, the can 110 is substantially cylindrical; however, other shapes (e.g., rectangular) are also possible. A first end of the can 110 may be or include a positive electrode (i.e., a cathode) 120, and a second end of the can 110 may be or include a negative electrode (i.e., an anode) 130.

In one embodiment, an outer surface of the can 110 may have a coating 140 applied thereto. The coating 140 may be or include a thermally-conducting layer of light-absorbing material. As described below, the coating 140 may allow laser radiation to be absorbed into the can 110 instead of being reflected therefrom. The coating 140 may adhere to the can 110 using non-organic matter to maintain proper adhesion during the heating process. In one example, the adhesive may be or include silicon, silicone, or both. Reducing the reflectance rate for the appropriate wavelength of laser improves the testing results. The coating 140 may be or include infrared (IR) coupling molecules (e.g., as found in high-temperature paints), long-wavelength absorbing optical materials such as Vantablack® or other superblack materials, a reacted or oxidized form of the parent metal (e.g., of the can 110), or a combination thereof. The coating 140 may be sprayed onto the can 110 (e.g., using an aerosol can or cup gun). In another embodiment, the coating 140 may be applied by a chemical reaction to oxidize or etch the surface of the can 110. In yet another embodiment, the coating 140 may be or include a sleeve that is slid over/around the can 110. The coating 140 may have a thickness from about 0.0001 inches to about 0.01 inches, about 0.0003 inches to about 0.005 inches, or about 0.0005 inches to about 0.002 inches.

Figure 2:
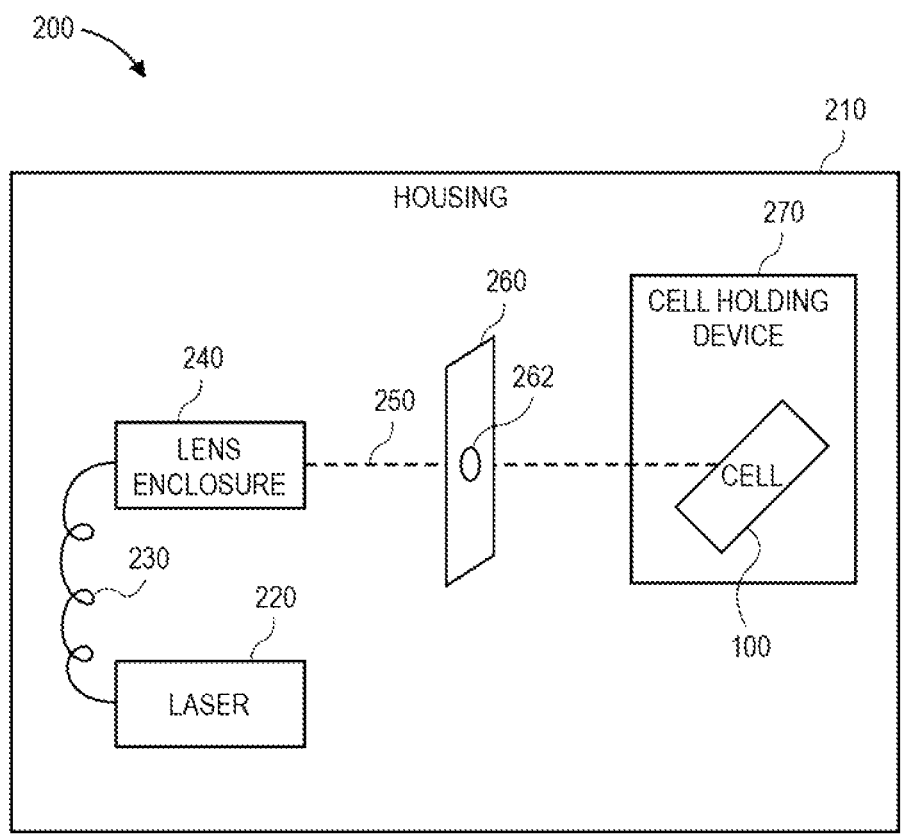
FIG. 2 illustrates a schematic view of a system for testing a battery cell, according to an embodiment.

FIG. 2 illustrates a schematic view of a system 200 for testing the battery cell 100, according to an embodiment. The system 200 may include a housing 210 defining an internal volume. The system 200 may also include a laser 220 that is positioned at least partially within the housing 210. The laser 220 may have a power level from about 10 watts to about 100 watts or about 25 watts to about 75 watts. The laser 220 may generate a laser radiation (e.g., a beam of light) 250, whose flux may vary depending on the type/properties of the can 110 of the battery cell 100 and/or the location on the can 110 that the laser radiation 250 contacts. The system 200 may also include a connector 230, which may be or include a cable (e.g., a fiber-optic cable). The system 200 may also include a lens enclosure 240 that is positioned at least partially within the housing 210. The connector 230 may be connected to and/or positioned between the laser 220 and the lens enclosure 240. The system 200 may also include a shield 260 that is positioned at least partially within the housing 210. In at least one embodiment, the shield 260 may define an opening 262. The system 200 may also include a cell holding device 270 that is positioned within the housing 210 and configured to hold the battery cell 100.

Figure 3:
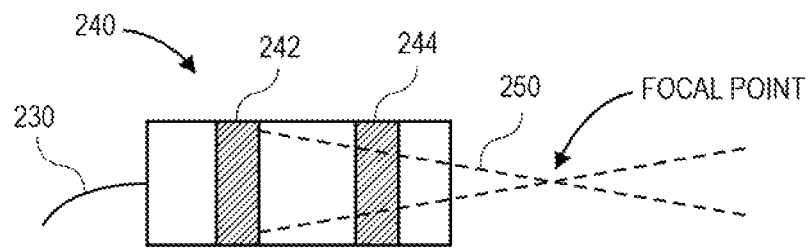
FIG. 3 illustrates a schematic view of a lens enclosure of the system, according to an embodiment.

FIG. 3 illustrates a schematic view of the lens enclosure 240, according to an embodiment. The lens enclosure 240 may include one or more lenses (two are shown: 242, 244). The lenses 242, 244 may protect the fiber optic cable 230 from debris during the thermal runaway event. The lenses 242, 244 may also collimate the laser radiation 250 from the laser 220. In one embodiment, the second (e.g., downstream) lens 244 may focus the laser radiation 250 to a desired focal point, which is preset to be on the coating 140 of the can 110.

Figure 4A:
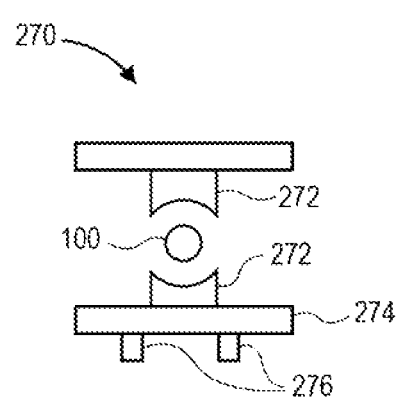
FIG. 4A illustrates a schematic side view of a cell holding device of the system.
Figure 4B:
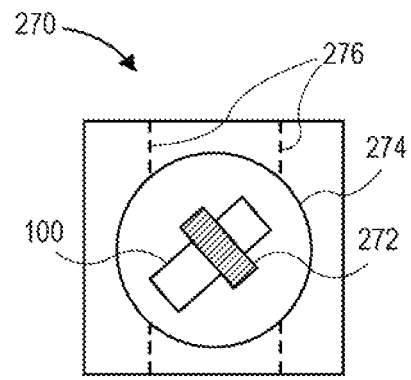
FIG. 4B illustrates a schematic top view of the cell holding device, according to an embodiment.

FIG. 4A illustrates a schematic side view of the cell holding device 270, and FIG. 4B illustrates a schematic top view of the cell holding device 270, according to an embodiment. The cell holding device 270 may include a clamp 272 that is configured to actuate between an open state and a closed state. The battery cell 100 may be introduced into the clamp 272 in the open state, and the clamp 272 may then be actuated into the closed state to hold/grip the battery cell 100 for testing. The clamp 272 may be moved along the length of the battery cell 100. In other words, the battery cell 100 may be moved axially within the clamp 272 into the desired position before the clamp is actuated into the closed state. The clamp 272 may include a stop that helps to locate the battery cell 100 in the desired position. The claim 272 may have two axes of linear motion.

The clamp 272 may be coupled to and/or positioned on a rotational movement device 274, which may be configured to rotate (e.g., pivot) the clamp 272 and the battery cell 100 in one, two, or three dimensions. This may be used to vary the location where the laser radiation 250 contacts the battery cell 100 and/or the angle at which the laser radiation 250 contacts the battery cell 250. It may also or instead be used to vary the surface area of the battery cell 100 that is contacted by the laser radiation 250.

The clamp 272 and/or the rotational movement device 274 may be coupled to and/or positioned on an axial movement device 276, which may be configured to move the rotational movement device 274, the clamp 272, and/or the battery cell 100 in one dimension (e.g., in an axial direction). The direction may be substantially perpendicular to the laser radiation 250. In one example, the axial movement device 276 may be or include one or more rails. The axial movement device 276 may be used to vary the location that the laser radiation 250 contacts the battery cell 100.

Figure 5:
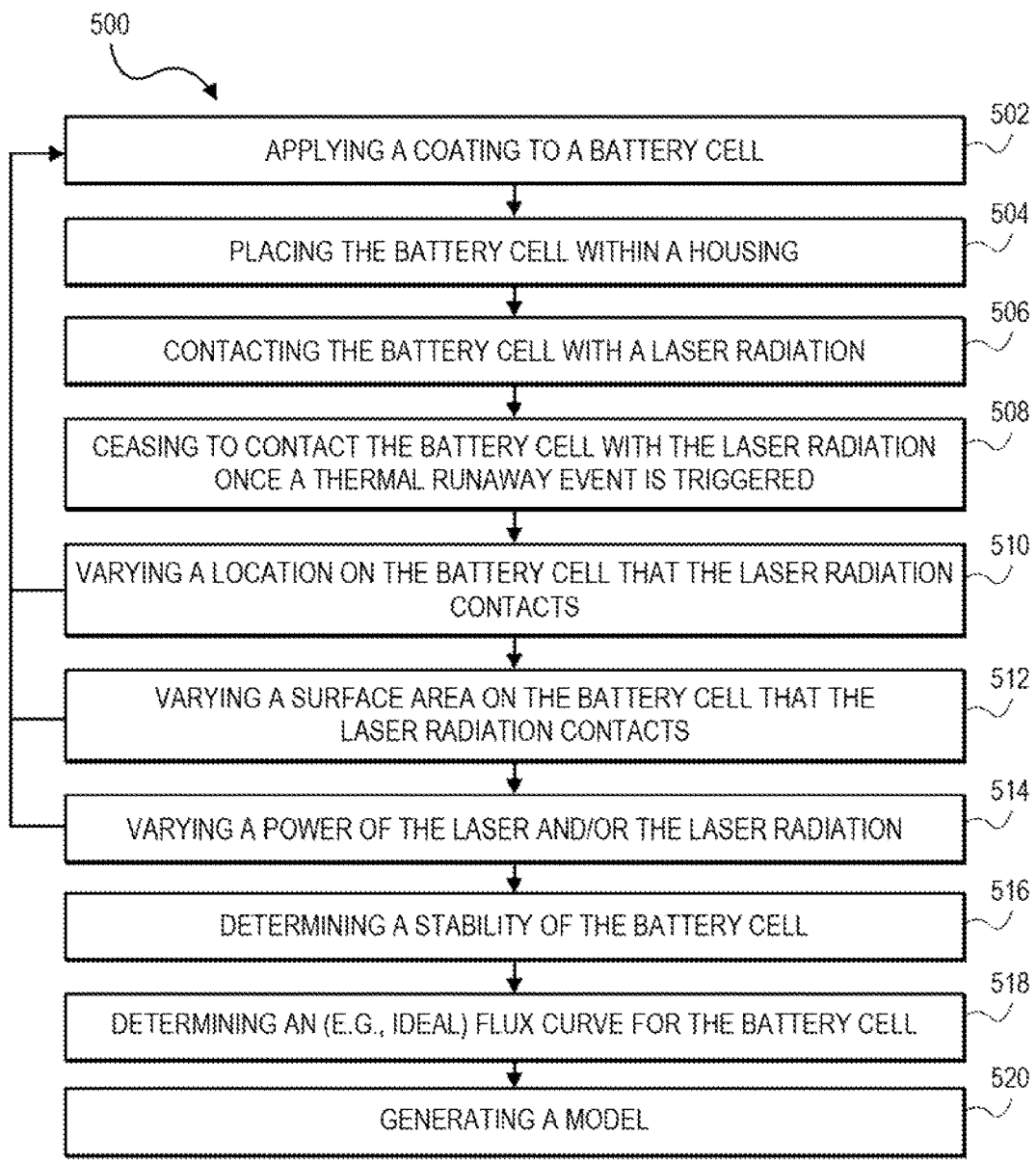
FIG. 5 illustrates a flowchart of a method for testing the battery cell, according to an embodiment.

FIG. 5 illustrates a flowchart of a method 500 for testing the battery cell 100, according to an embodiment. An illustrative order of the method 500 is provided below; however, one or more steps may be performed in a different order, repeated, or omitted altogether.

The method 500 may include applying the coating 140 to the battery cell 100, as at 502. More particularly, the coating 140 may be applied to the outer surface of the can 110.

The method 500 may also include placing the battery cell 100 within the housing 210, as at 504. This may include placing the battery cell 100 within the cell holding device 270 in the housing 210. More particularly, this may include placing the battery cell 100 within the clamp 272 of the cell holding device 270.

The method 500 may also include contacting the battery cell 100 with the laser radiation 250, as at 506. In one embodiment, the laser radiation 250 may be generated by the laser 220 and may travel through the connector 230 to the lens enclosure 240. The lens enclosure 240 may focus and/or direct the laser radiation 250 so that it travels through the opening 262 in the shield 260 and contacts the battery cell 100. In another embodiment, the connector 230, the lens enclosure 240, the shield 260, the cell holding device 270, or a combination thereof may be omitted, and the laser 220 may be placed in close proximity with (e.g., within about 5 cm, within about 3 cm, or within about 1 cm) or in contact with the battery cell 100. In this embodiment, the laser 220 may emit the laser radiation 250, which may contact the battery cell 100.

The laser radiation 250 may contact the coating 140 on the can 110. The coating 140 may be configured to absorb at least a portion of the laser radiation 250, which transfers incident beam energy into and through the wall of the can 110. This energy transfer locally heats outer layers of an electrode and/or a separator within the battery cell 100, which creates a local internal short circuit. In some embodiments, the laser 220 creates a zone of highly localized heat energy that transfers through the wall of the can 110 and melts nearby layers of the cell separator. This melting of layers and/or transfer of heat energy may heat the battery cell 100, which may induce a thermal runaway event. During the thermal runaway event, the battery cell 100 may experience rapid exothermic decomposition that ultimately results in the release of heat and high-temperature gases and other ejected material. The heat, gas, and/or ejected material may be contained within the housing 210. The shield 260 may substantially protect the laser 220 and the lens enclosure 240 from the heat, gas, and/or ejected material. In at least one embodiment, the laser radiation 250 may induce the thermal runaway event without perforating the can 110 of the battery cell 100. For example, the laser radiation 250 may induce the thermal runaway event without perforating the can 110 of the battery cell 100 proximate to the location where the laser radiation 250 contacts the battery cell 100.

The laser radiation 250 may contact the battery cell 100 (e.g., the coating 140 on the can 110) until the thermal runaway event is triggered. This may be for a time duration that is from about 5 seconds to about 180 seconds, about 10 seconds to about 90 seconds, or about 20 seconds to about 60 seconds. Once the thermal runaway event is triggered, the method 500 may include ceasing to contact the battery cell 100 with the laser radiation 250, as at 508. Thus, the time duration may end within about 2 seconds, about 1 second, or about 0.5 seconds, or less than 0.5 seconds after the thermal runaway event is triggered. For example, the laser radiation 250 may cease substantially simultaneously with the triggering of the thermal runaway event. This may minimize the amount of excess power and/or heat that is introduced into the battery cell 100, which may simulate a more realistic thermal runaway event.

The method 500 may be iterative. Thus, at least a portion of the method 500 (e.g., steps 502, 504, 506, 508, or a combination thereof) may be repeated. Each iteration may trigger a thermal runaway event in a new/different battery cell. In a first plurality of iterations, one or more parameters may be held constant. For example, the type of battery cell 100 (e.g., the size, model, material, and/or chemistry), the orientation of the battery cell 100, the type of coating 140

(e.g., material, thickness, etc.), the thermal losses, the location on the battery cell 100 that the laser radiation 250 contacts, the target area on the battery cell 100 that the laser radiation 250 contacts, the power/wattage of the laser radiation 250, or a combination thereof may be held substantially constant during the first plurality of iterations.

Figure 6:
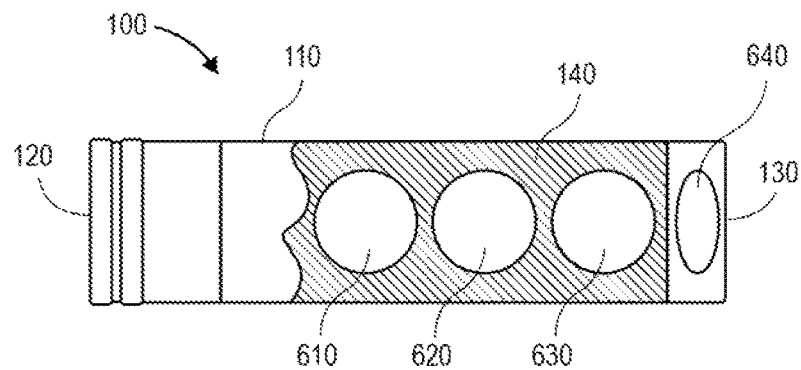
FIG. 6, which illustrates a side view of the battery cell showing different locations where the battery cell is contacted by the laser radiation, according to an embodiment.

In a second plurality of iterations, one (or more) of the parameters may be varied. For example, the method 500 may include varying a location on the battery cell 100 that the laser radiation 250 contacts, as at 510. In at least one embodiment, the other parameters may be held constant while the location is varied. An example of varying the location is shown in FIG. 6, which illustrates a side view of the battery cell 100 showing different locations (four are shown: 610, 620, 630, 640) where the battery cell 100 may be contacted by the laser radiation 250, according to an embodiment. In this example, the laser radiation 250 contacts four different, axially-offset locations 610, 620, 630, 640 on the battery cell 100. The first location 610 is closest to the first end of the battery cell 100 (e.g., the positive electrode 120). The fourth location 640 is closest to the second end of the battery cell 100 (e.g., the negative electrode 130). Varying the location that the laser radiation 250 contacts the battery cell 100 may be accomplished by moving the battery cell 100. As mentioned above, the battery cell 100 and the clamp 272 may be moved in an axial direction using the axial movement device 276. The location may also or instead be varied by rotating the battery cell 100 and/or the clamp 272 using the rotational movement device 274.

The battery cell 100 includes distinct features at either end, and these may affect how heat travels through the battery cell 100. For example, the location 130 (see FIG. 1) is adjacent to a thicker region of the can 110. The thicker region slows the heat transfer; however, the thicker region is flat and couples well, which may speed up the heat transfer process. The tab for the negative leg is welded directly to the negative current collector and the can 110 in this location, which would appear to make this an ideal location to transmit heat deep into the battery cell 100. However, this is also a thick plastic spacer at the bottom of the battery cell 100 that acts as an insulator. The testing yielded results that indicated that the location 130 produces thermal runaway in about 2.5 minutes, and the location 630 produces thermal runaway in about 1 minute. As such, the method 500 may be used to determine whether this change in speed also affects burst percentage and the failure mode.

In a third plurality of iterations, one (or more) of the parameters may be varied. For example, the method 500 may include varying a surface area (also referred to as a target area) on the battery cell 100 that the laser radiation 250 contacts, as at 512. In at least one embodiment, the other parameters may be held constant while the surface area is varied. The surface area may be varied by varying the focus of the lens enclosure 240. The surface area may also or instead be varied by rotating the battery cell 100 and/or the clamp 272 using the rotational movement device 274. Referring back to FIG. 6, it may be seen that the fourth location 640 where the laser radiation 250 contacts the battery cell 100 has a smaller surface area than the other locations 610, 620, 630. Decreasing the surface area may increase the concentration of the power/heat that is introduced into the battery cell 100.

In one embodiment, the surface area may be varied during a single iteration. For example, the surface area may be varied from 1 cm$^2$ to 0.5 cm$^2$ during a single iteration while the laser radiation 250 contacts the location 610. In another embodiment, the surface area may be varied from one iteration to the next. For example, the surface area may be held substantially constant at 1 cm$^2$ in the location 610 in one iteration, and the surface area may be held substantially constant at 0.5 cm$^2$ in the location 640 in a subsequent iteration.

In a fourth plurality of iterations, one (or more) of the parameters may be varied. For example, the method 500 may include varying a power (e.g., wattage) of the laser 220 and/or the laser radiation 250, as at 514. In at least one embodiment, the other parameters may be held constant while the power is varied. The power may be varied by adjusting the laser 220. The power may also or instead be varied by varying the focus of the lens enclosure 240.

In one embodiment, the power may be varied during a single iteration. For example, the power may be varied from 25 watts to 50 watts during a single iteration while the laser radiation 250 contacts the location 610. In another embodiment, the power may be varied from one iteration to the next. For example, the power may be held substantially constant at 25 watts in the location 610 in one iteration, and the power may be held substantially constant at 50 watts in the location 610 in a subsequent iteration.

The method 500 may also include determining a (e.g., test) stability of the battery cell(s) 100, as at 516. As used herein, "stability" and/or "test stability" refer to the ability or likelihood of the battery cell 100 to vent and fail in a natural way (e.g., without breaching through the can 110 in the spot of the laser radiation 250) in response to steps 506, 508, 510, 512, 514, or a combination thereof. The test stability of the battery cell(s) 100 may be determined based at least partially upon the laser radiation 250 contacting the battery cell 100 (as at 506), the location being varied (as at 510), the surface area being varied (as at 512), the power being varied (as at 514), the type and thickness of coating 140 being varied, or a combination thereof.

For example, this step may include determining a cloud of upper and lower bounds of power input. The cloud of upper and lower bounds of power input may be determined at a range of beam sizes (e.g., surface areas), with the aim of connecting those bounds into concentric regions, where the test stability is highest. As used herein, "region" may be the connection of discrete points on a chart that are linked to given percentages of battery cell breaches (e.g. a 10% breach chance curve) of the battery cell(s) 100 with increasing stability.

In one example, the location and the surface area may be held substantially constant, and the power may be varied (e.g., increased from low power to high power) to determine an upper bound and a lower bound for a suitable wattage for the location on the battery cell 100 before varying the location and/or the surface area. As used herein, the "upper bound" refers to the highest/strongest combination of variables that the battery cell 100 can withstand before demonstrating failure modes with signs of external interference, and the "lower bound" refers to the lower end of that limit where the battery cell 100 starts to demonstrate the desired failure modes. As used herein. "a failure mode" refers to a thermal runaway event and/or more general modes of where the battery cell 100 fails.

Figure 7:
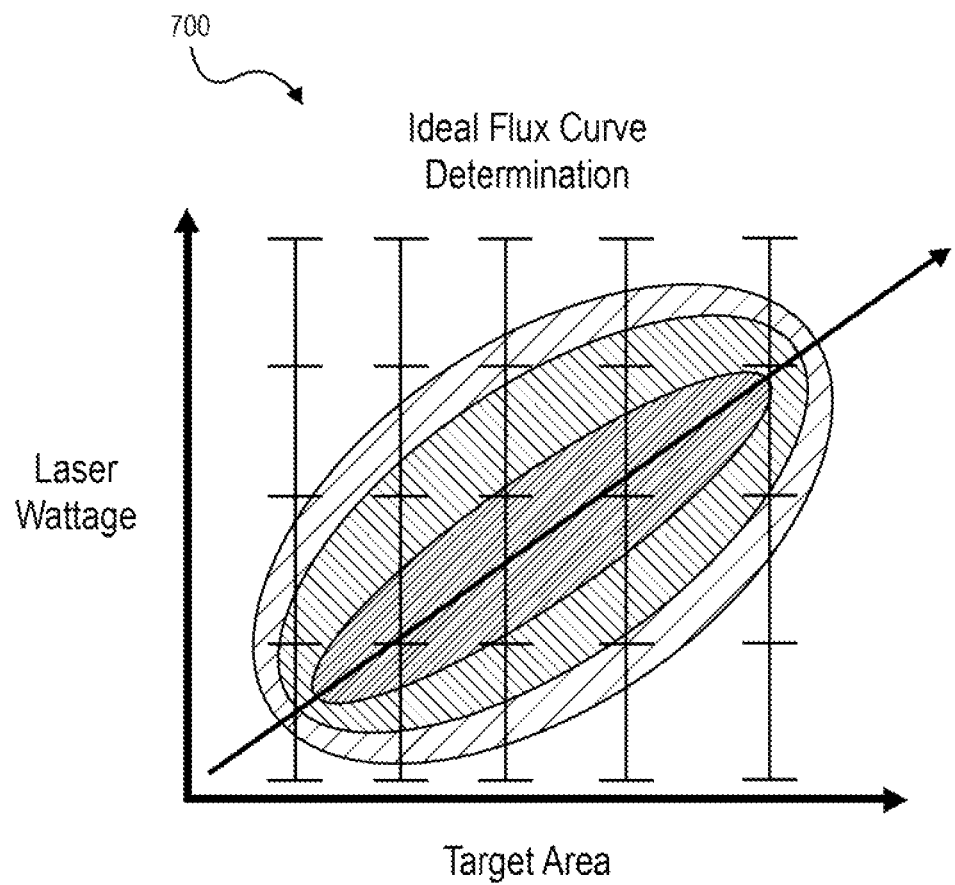
FIG. 7 illustrates a graph showing an ideal flux curve determination, according to an embodiment.

The method 500 may also include determining an (e.g., ideal) flux curve for the battery cell(s) 100, as at 518. FIG. 7 illustrates an ideal flux curve 700, according to an embodiment. The ideal flux curve 700 may be determined based at least partially upon the laser radiation 250 contacting the battery cell 100 (in step 506), the location being varied (in step 510), the surface area being varied (in step 512), the power being varied (in step 514), the test stability (in step 516), or a combination thereof. The ideal flux curve 700 passes through the center of all of the concentric regions of test stability described above with respect to step 516. The ideal flux curve 700 may allow a user to assess the influence of the varied parameters (e.g., in steps 510, 512, and/or 514) on the failure response of the battery cells 100, and to assess the innate differences between any manufactured battery cells 100.

The method 500 may also include generating a model, as at 520. The model may be generated based at least partially upon the test stability of the battery cell(s) 100 (in step 516), the ideal flux curve 700 for the battery cell(s) 100 (in step 518), or both. The model may allow the user to assess or simulate the influence of the varied parameters (e.g., in steps 510, 512, and/or 514) on the failure response of the battery cells 100 in an environment with no external influence. The model may be used in a variety of matters including, testing of battery packs to verify safety measures during a realistic thermal runaway event, and quantifying energy output from cells 100 during a realistic thermal runaway event.

In one embodiment, the laser radiation 250 may contact the battery cell 100 at the location 640, the surface area may be from about 0.2 inches to about 0.6 inches or about 0.3 inches to about 0.5 inches, and the power may be from about 27 watts to about 39 watts or about 30 watts to about 36 watts. In another, embodiment, the laser radiation 250 may contact the battery cell 100 at the location 630, the surface area may be from about 0.2 inches to about 0.6 inches or about 0.3 inches to about 0.5 inches, and the power may be from about 34 watts to about 46 watts or about 37 watts to about 43 watts.

High flux allows the energy of the laser radiation 250 to overcome losses due to conduction away from the target through the can 110. If the flux is determined, the power (e.g., wattage) of the laser 220 and/or the laser radiation 250 may be decreased to provide only the amount of energy into the battery cell 100 needed to trigger the thermal runaway event (and little to no more). Said another way, once the flux is determined, the user may modify (e.g., reduce) the power level of the laser 220 and/or the laser radiation 250 to the minimum level needed to induce the thermal runaway event. Reducing the power level may minimize the temperature increase of the can 110, which may simulate a more realistic thermal runaway event.

Thus, the method 500 applies the minimum amount of energy to induce the thermal runaway event. To accomplish this, the surface area is less than in conventional thermal runaway testing, and the flux of energy is greater than in conventional thermal runaway testing. This allows the testing to outcompete diffusion, convection, etc. testing, and to avoid creating local hot spots on the battery cell 100, which locally destroy the separator layer in the battery cell 100. As soon as the battery cell 100 goes into thermal runaway, the laser radiation 250 no longer contacts the battery cell 100 such that very few (e.g., zero) joules of energy are added to the battery cell 100 via the laser radiation 250 after that time. This leads to less bias in the results of the testing as compared to traditional heater methods.

Table 1 (below) illustrates results from a plurality of iterations testing the battery cells 100 using the method 500.

TABLE 1

| Target Wattage (W) | Actual Wattage (W) | Dome % | Breach % | Average time to TR (s) | Standard Deviation(s) | Min (s) | Max (s) |
|---|---|---|---|---|---|---|---|
| 40 | 37.8 | 60 | 20 | 78 | 51.83 | 15 | 160 |
| 50 | 48.2 | 80 | 40 | 24.6 | 27.81 | 6 | 80 |
| 60 | 57.6 | 100 | 20 | 17.8 | 8.77 | 5 | 28 |
| 70 | 67.3 | 100 | 100 | 16.2 | 12.93 | 8 | 42 |

In Table 1, the target wattage refers to the desired/intended power level of the laser radiation 250, and the actual wattage refers to the actual power level of the laser radiation 250. The dome % refers to the percentage of battery cells that displayed a physical alteration (e.g., dome) at the point of the laser radiation 250. The breach % refers to the percentage of battery cells that displayed a physical breach (e.g., cut) in the can wall 110 at the point of the laser radiation 250. This occurs when too much heat/energy is introduced into the battery cell 100. For example, this may occur when the upper bound is exceeded. The average time to TR refers to the average amount of time before a thermal runaway event was triggered in the battery cell 100. The "min" refers to the minimum amount of time before a thermal runaway event was triggered in the battery cell 100, and the "max" refers to the maximum amount of time before a thermal runaway event was triggered in the battery cell 100. Table 1 shows the start of the generation of data to generate the graph 700 in FIG. 7.

Figure 8:
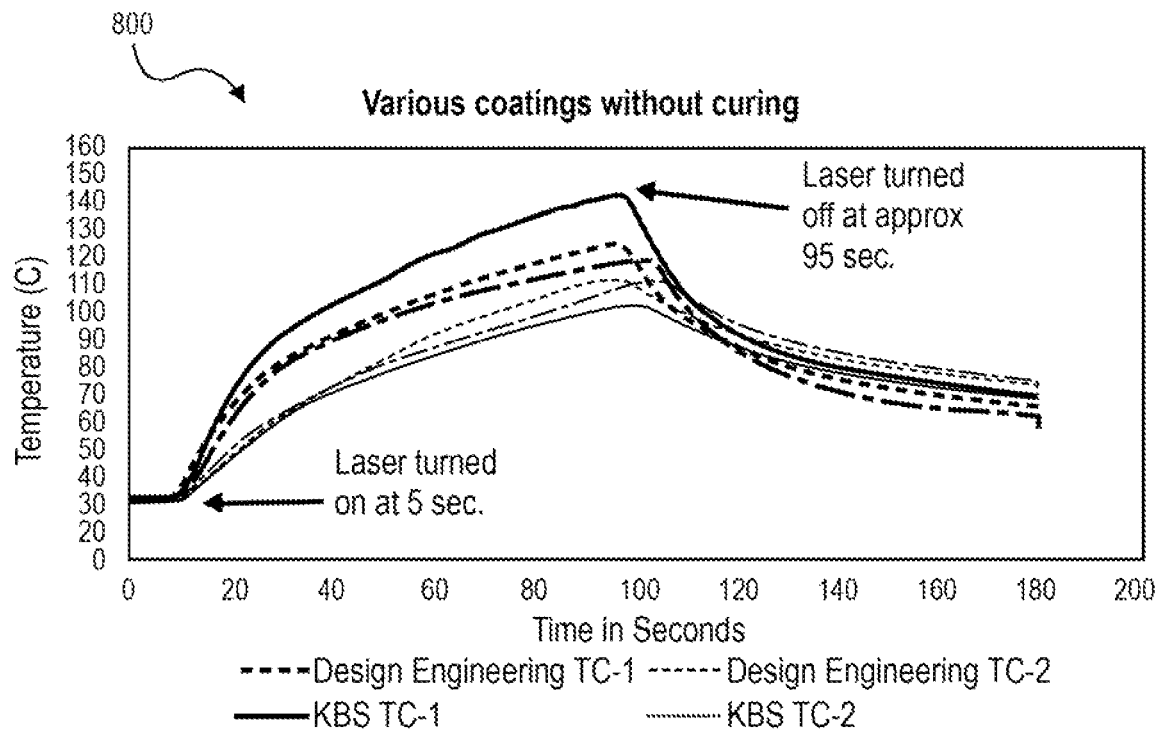
FIG. 8 illustrates a graph showing absorption rates for different coatings without curing the coatings, according to an embodiment.
Figure 9:
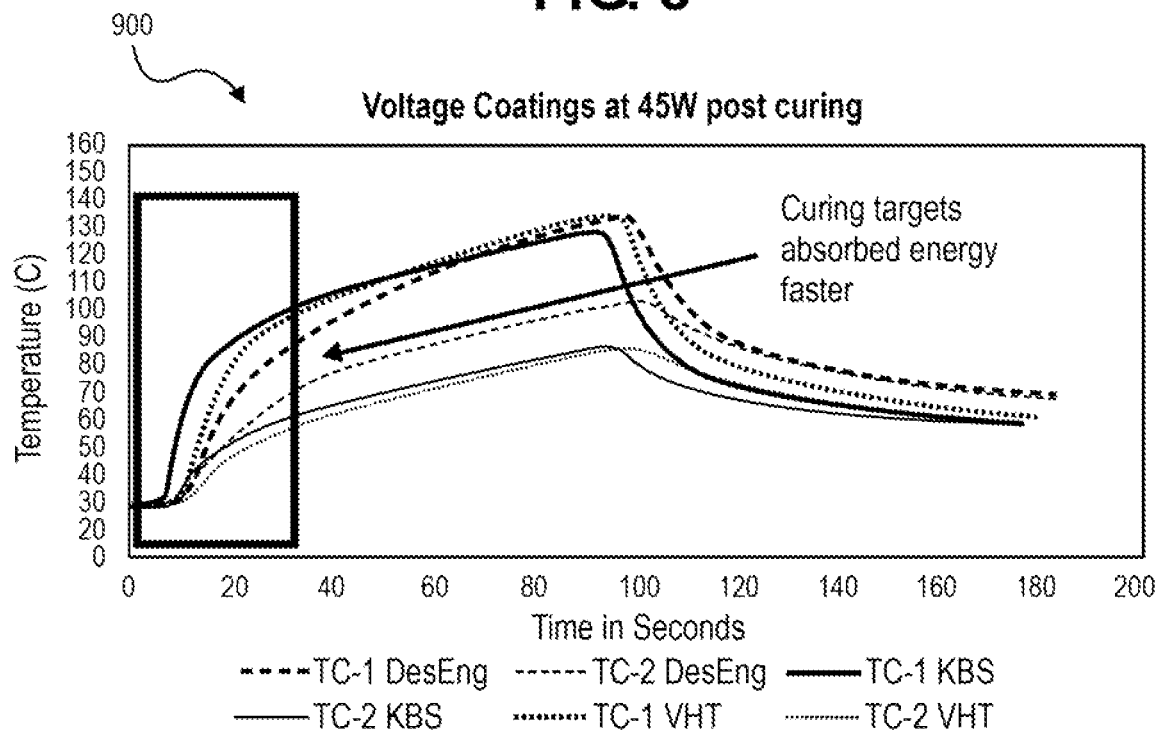
FIG. 9 illustrates a graph showing absorption rates for different coatings with curing the coatings, according to an embodiment.

FIG. 8 illustrates a graph 800 showing absorption rates for different coatings 140 when the coatings 140 are not cured, according to an embodiment. FIG. 9 illustrates a graph 900 showing absorption rates for different coatings 140 when the coatings 140 are cured, according to an embodiment.

As may be seen, curing the coatings 140 causes the energy from the laser radiation 250 to be absorbed faster. Curing the coating 140 on the battery cell 100 allowed better adhesion of the coating 140 to the can 110. As a result, during the laser trigger process described above, the coating 140 is less likely to ablate away because it is better adhered due to the curing. The different lines represent different (e.g., black) spray paints that are designed to withstand high heat. The coatings 140 may include a non-organic binder that allows the coating 140 to better stick to the can 110. An organic binder may burn away under the heat. The coatings 140 may also include high absorption rates of low-end IR wavelengths and strong thermal conductivity to allow for a majority of the energy from the laser radiation 250 to be absorbed.

The coating 140 may provide 90% or more absorption of the energy and/or heat from the laser radiation 250. Chemically, the coating 140 may have multiples of the input energy as resonant frequencies of the bonds in the structure. In other words, the incident energy may cause additive interference to those waves and add energy to those bonds, making them increase in temperature. However, the coating 140 should have a curing temperature that is less than the threshold to trigger a thermal runaway event.

In at least one embodiment, the coating 140 may be applied to the battery cell 100 (e.g., to the can 110). The coating 140 may cover at least a portion of a first radiation-receiving location (e.g., location 610, 620, and/or 630). The laser 220 may be set in a first (e.g., curing) mode to direct the laser radiation 250 to the coating 140 to cure the coating. The laser is operating at a first laser power when in the curing mode. The curing may occur at a temperature that does not trigger the thermal runaway event. The laser 220 may then be set in a second (e.g., heating) mode to direct the laser radiation 250 to the cured coating 140 to generate the thermal runaway event. The laser is at a second laser power when in the heating mode. The second laser power is greater than the first laser power. In at least one embodiment, the coating 140 may be cured without using the laser 220 or the laser radiation 250.

Figure 10:
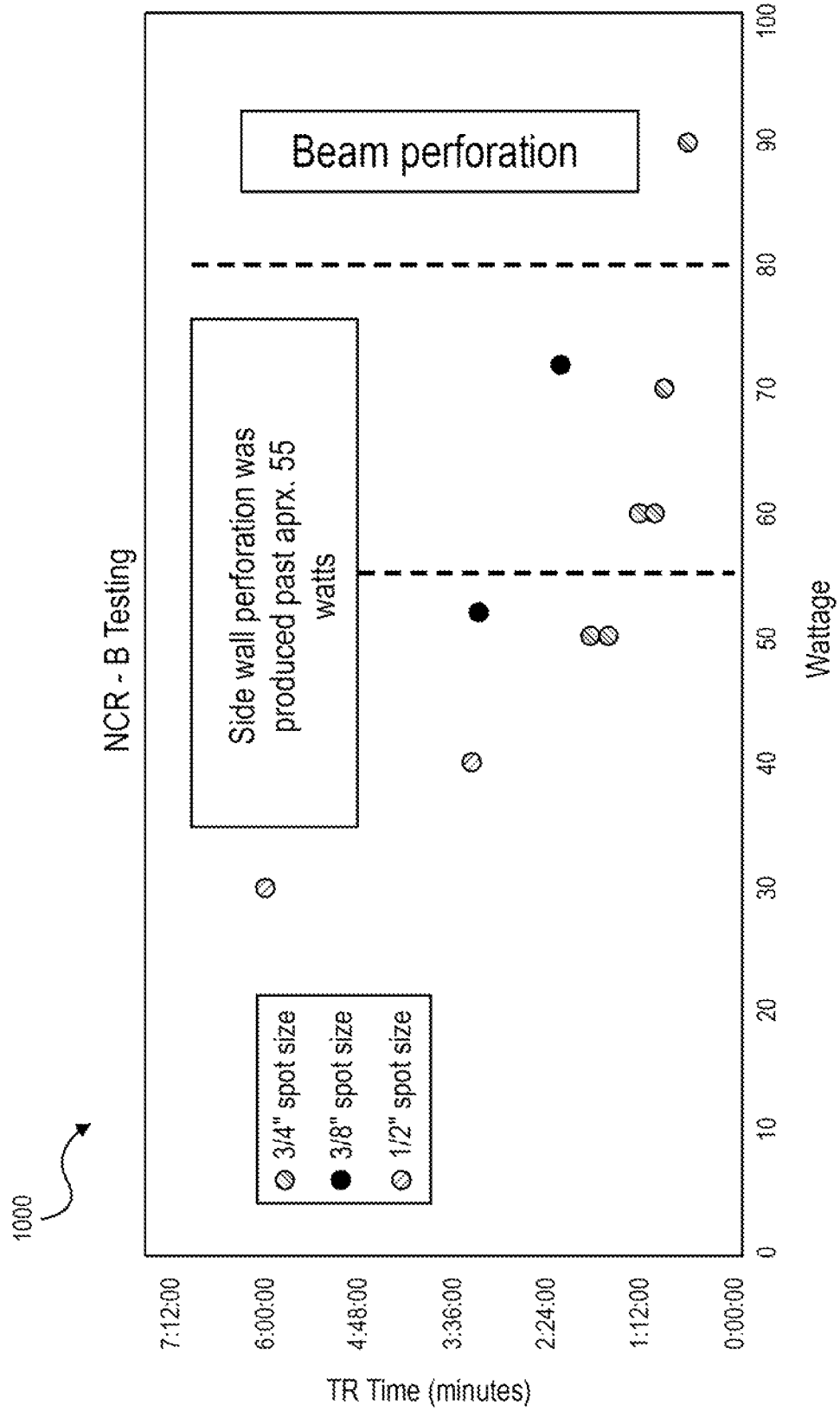
FIG. 10 illustrates a graph showing results from a plurality of iterations with varying surface area and power, according to an embodiment.

FIG. 10 illustrates a graph 1000 showing results from a plurality of iterations with varying surface area and power, according to an embodiment. In FIG. 10, the battery cell 100 that was tested was a Panasonic® NCR-B cell. The side wall of the battery cell 100 did not perforate during a thermal runaway event when the laser 220 and/or the laser radiation 250 used to induce the thermal runaway event had a power of less than about SS watts. The side wall of the battery cell 100 perforated during the thermal runaway events when the laser 220 and/or the laser radiation 250 used to induce the thermal runaway event had a power of greater than about SS watts. In addition, the side wall of the battery cell 100 perforated at the location where the laser radiation 250 contacted the battery cell 100 when the laser 220 and/or the laser radiation 250 used to induce the thermal runaway event had a power of greater than about 80 watts.

As mentioned above, inducing a thermal runaway event without perforating the side wall of the battery cell 100 simulates a more realistic thermal runaway event. Increasing the surface area causes the flux to decrease because the energy is dispersed in a larger area. This may lead to a longer time to thermal runaway, which may not simulate a realistic thermal runaway event. However, a larger surface area is less likely to perforate the wall of the can 110. The surface area may be reduced to focus the energy, leading to a higher flux, which may overheat parts of the can wall and may weaken them. This may cause the can 110 to perforate when the cell 100 goes into thermal runaway. This also may not simulate a realistic thermal runaway event. Thus, a predetermined surface area may be determined using the method 500 that balances the time to reach thermal runaway with the likelihood to perforate the can 110. This may simulate a realistic thermal runaway event.

Figure 11:
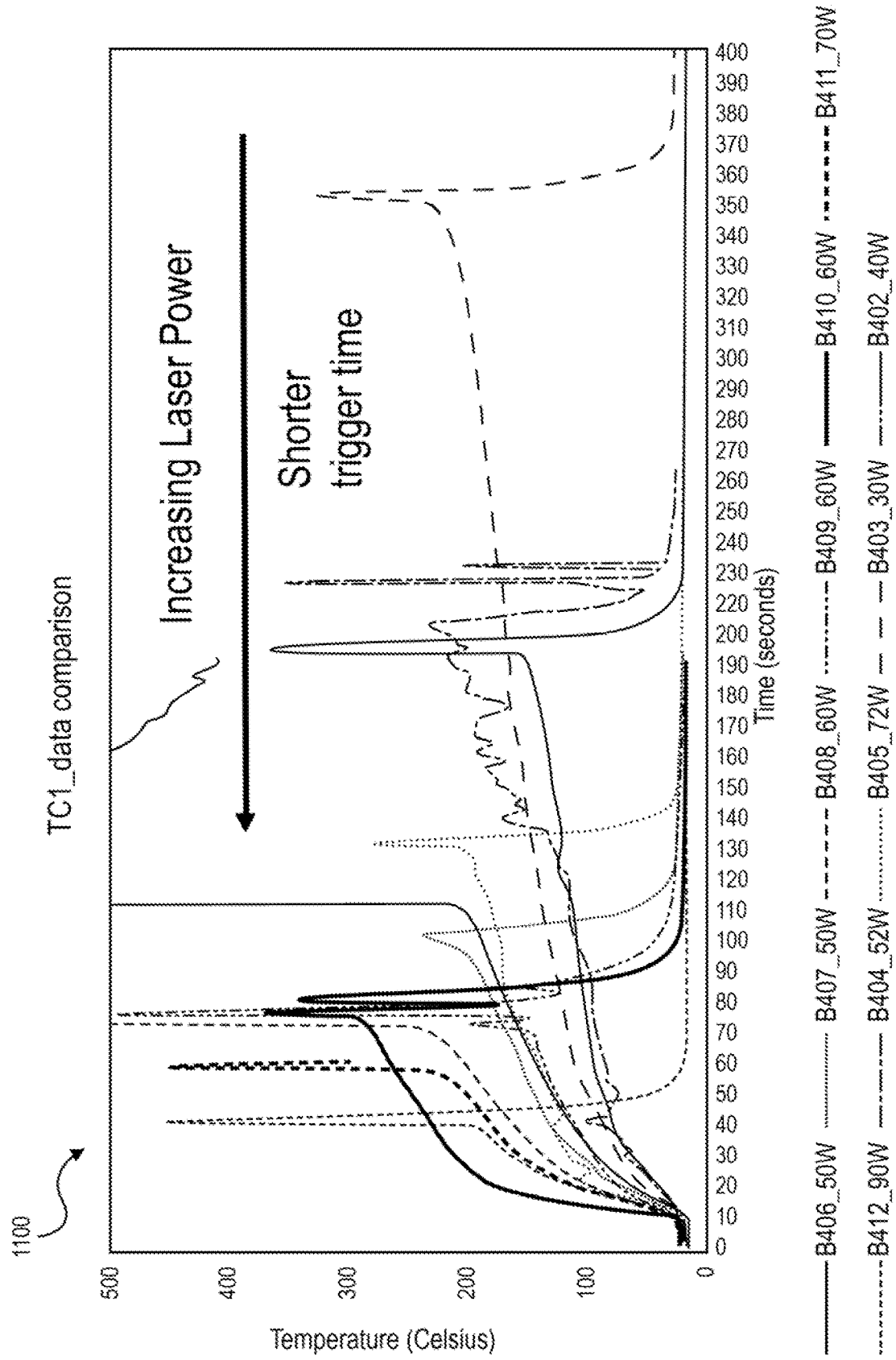
FIG. 11 illustrates a graph showing results from a plurality of iterations with varying power, according to an embodiment.

FIG. 11 illustrates a graph 1100 showing results from a plurality of iterations with varying power, according to an embodiment. In FIG. 11, the battery cell 100 that was tested was a Panasonic® NCR-B cell. The location and the surface area were held constant. As may be seen, as the power increases, the time to induce the thermal runaway event decreased. In addition, as the power increases, the likelihood that the side wall of the battery cell 100 perforates (e.g., at the location where the laser radiation 250 contacted the battery cell 100) also increased.

Figure 12:
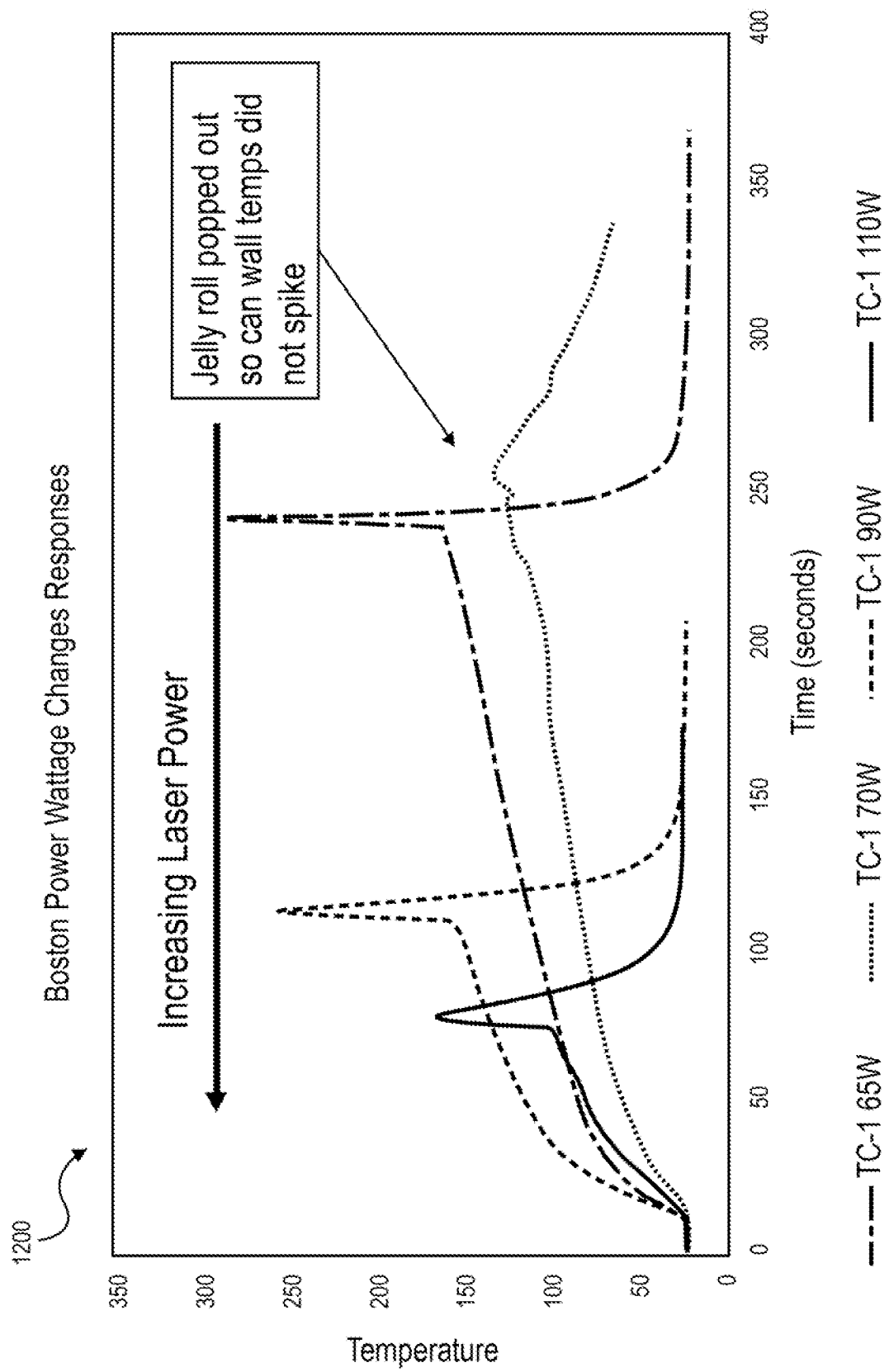
FIG. 12 illustrates another graph showing results from a plurality of iterations with varying power, according to an embodiment.

FIG. 12 illustrates another graph 1200 showing results from a plurality of iterations with varying power, according to an embodiment. In FIG. 12, the battery cell 100 that was tested was a Boston Power® Swing cell. The location and the surface area were held constant. The parameters to trigger a thermal runaway event are different due to a higher thermal conductivity of aluminum in the battery cell 100.

The system and method described above have several advantages over conventional systems and methods. For example, no physical object (e.g., a nail) contacts the battery cell 100 to induce the thermal runaway event, and this leads to less bias in the results. Also, the energy input of the laser 220 and/or the laser radiation 250 are highly repeatable with minimal (e.g., less than 3%) variation. In addition, no hand labor is needed to create heaters to induce the thermal runaway event.

What is claimed is:

1. A method of testing a battery cell using a laser system, the battery cell having a cell container made of metal, the method comprising:
    applying a beam-absorbing coating on the cell container, the beam-absorbing coating covering at least a portion of a first radiation-receiving location of the cell container;
    operating the laser system in a curing mode to direct radiation to the beam-absorbing coating to cure the beam-absorbing coating to form a cured coating, wherein the laser is at a first laser power when in the curing mode; and
    operating the laser system in a thermal-heating mode to direct radiation to the cured coating to heat the battery cell to generate a thermal runaway condition, wherein the laser is at a second laser power when in the thermal heating mode, and wherein the second laser power is greater than the first laser power.

2. A method for testing a battery cell, the method comprising:
    applying a coating to a radiation-receiving location on a can of the battery cell;
    curing the coating, wherein the coating is cured at a temperature that does not trigger a thermal runaway event;
    directing a laser radiation from a laser at the radiation-receiving location on the can of the battery cell to trigger the thermal runaway event, wherein a power, a wavelength, and a beam size of the laser radiation are selected based on a test stability of the battery cell when triggering the thermal runaway event, and wherein the test stability comprises a likelihood that the can will breach in response to triggering the thermal runaway event; and
    ceasing to contact the radiation-receiving location with the laser radiation in response to the thermal runaway event.

3. The method of claim 1, further comprising:
    performing a plurality of preliminary testing iterations with the laser on a plurality of preliminary test battery cells to trigger thermal runaway events in the preliminary test battery cells; and
    generating a model based on the plurality of preliminary testing iterations, wherein the model includes a first region having a first likelihood that the cans of the preliminary test battery cells will breach in response to triggering the thermal runaway events in the preliminary test battery cells,
    wherein the model includes a second region having a second likelihood that the cans of the preliminary test battery cells will breach in response to triggering the thermal runaway events in the preliminary test battery cells, wherein the first breach likelihood is less than the second breach likelihood, and wherein the test stability of the battery cell is based on the model.

4. The method of claim 1, further comprising:
    determining a stability of the battery cell based at least partially upon the thermal runaway event;
    generating a model based at least partially upon the stability of the battery cell; and simulating additional thermal runaway events on additional battery cells with varied parameters based at least partially upon the model, wherein the varied parameters comprise the radiation-receiving locations on the additional battery cells, surface areas on the additional battery cells, the power of the laser radiation, or a combination thereof.

5. A method for testing a plurality of battery cells, the method comprising:
- applying a coating to a radiation-receiving location on at least one can of the plurality of battery cells;
- curing the coating, wherein the coating is cured at a temperature that does not trigger a thermal runaway event;
- directing a laser radiation at the battery cells until a thermal runaway event is triggered in each battery cell;
- determining a stability of the battery cells based at least partially upon the thermal runaway events, wherein the stability comprises a likelihood that the battery cells will vent and fail without breaching through a can of each battery cell where the laser radiation contacts the can; and
- generating a model based at least partially upon the stability of the battery cells.

6. The method of claim 5, wherein a location of the laser radiation on a first of the battery cells is different than a location of the laser radiation on a second of the battery cells.

7. The method of claim 5, wherein a surface area of the laser radiation on a first of the battery cells is different than a surface area of the laser radiation on a second of the battery cells.

8. The method of claim 5, wherein a power of the laser radiation on a first of the battery cells is different than a power of the laser radiation on a second of the battery cells.

9. The method of claim 5, further comprising simulating additional thermal runaway events on additional battery cells with varied parameters based at least partially upon the model, wherein the varied parameters comprise a location of the laser radiation on the additional battery cells, a surface area of the laser radiation on the additional battery cells, a power of the laser radiation, or a combination thereof.

10. A method for testing a battery cell, the method comprising:
- applying a beam-absorbing coating on a can of the battery cell, the beam-absorbing coating covering at least a portion of a radiation-receiving location;
- operating a laser in a curing mode to direct a laser radiation to the beam-absorbing coating to cure the beam-absorbing coating and form a cured coating, wherein a power of the laser radiation is at a first level when in the curing mode;
- operating the laser in a thermal-heating mode to direct the laser radiation to the cured coating and heat the battery cell to trigger a thermal runaway event, wherein the power of the laser radiation is at a second level when in the thermal heating mode, and wherein the second level is greater than the first level;
- wherein the power, a wavelength, and a beam size of the laser radiation are selected based on a test stability of the battery cell when triggering the thermal runaway event, and wherein the test stability comprises a likelihood that the can will breach in response to triggering the thermal runaway event; and
- ceasing to contact the radiation-receiving location with the laser radiation in response to the thermal runaway event.

* * * * *